US007480188B2

(12) United States Patent
Nakamuta et al.

(10) Patent No.: US 7,480,188 B2
(45) Date of Patent: Jan. 20, 2009

(54) MEMORY ACCESS APPARATUS

(75) Inventors: Kazuhiro Nakamuta, Gunma-ken (JP);
Iwao Honda, Gunma-ken (JP); Takashi Kuroda, Gunma-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 61 days.

(21) Appl. No.: 11/734,749

(22) Filed: Apr. 12, 2007

(65) Prior Publication Data

US 2007/0242533 A1    Oct. 18, 2007

(30) Foreign Application Priority Data

Apr. 13, 2006    (JP)    .............................. 2006-111318

(51) Int. Cl.
*G11C 7/10*    (2006.01)
(52) U.S. Cl. ................... 365/189.01; 365/233; 365/191
(58) Field of Classification Search ............ 365/189.01, 365/233, 191, 52, 185.04, 230.04, 185.08
See application file for complete search history.

(56) References Cited

U.S. PATENT DOCUMENTS 7,321,524 B2 * 1/2008 Shaeffer et al. .......... 365/233.1
2005/0276151 A1 * 12/2005 White et al. ................ 365/233

FOREIGN PATENT DOCUMENTS

JP    2002-064368    2/2002
WO    WO 96/37830    11/1996

OTHER PUBLICATIONS

Intellectual Property Office, Office Action for Korean Patent Application No. 10-2007-36111, mail date of Jul. 21, 2008.

* cited by examiner

*Primary Examiner*—Dang T Nguyen
(74) *Attorney, Agent, or Firm*—SoCal IP Law Group LLP; Steven C. Sereboff; John E. Gunther

(57) ABSTRACT

A memory access apparatus reading data from a memory, the memory including a terminal that address information is input to, a terminal that a clock signal changing at a predetermined cycle is input to, a terminal that a read command is input to, and a terminal that outputs data stored at an address identified by the address information at a timing of the clock signal changing from one level to the other level in accordance with the read command, the memory access apparatus comprising: an address information output unit that outputs the address information and the read command at a first timing of the clock signal changing from the one level to the other level; and a read data storage unit that stores data output from the memory at a second timing after the first timing of the clock signal changing from the one level to the other level, the read data storage unit storing the data at a third timing after the second timing of the clock signal changing from the one level to the other level.

6 Claims, 10 Drawing Sheets

• WHEN WRITE AND READ ARE ALTERNATED

• WHEN READ IS CONTINUED AFTER WRITE

• WHEN VALUE IN DATA STORAGE UNIT IS READ

MEMORY ACCESS APPARATUS

CROSS-REFERENCE TO RELATED APPLICATION

This application claims the benefit of priority to Japanese Patent Application No. 2006-111318, filed Apr. 13, 2006, of which full contents are incorporated herein by reference.

BACKGROUND OF THE INVENTION

1. Field of the Invention

The present invention relates to a memory access apparatus that can speed up memory access.

2. Description of the Related Art

Recently, digital control is utilized in various electronic products such as television and audio devices. With the advancement of technology, speedup is achieved for a clock signal that controls electronic circuits configuring these electronic products.

For this purpose, various technologies have been developed (see, e.g., Japanese Patent Application Laid-Open Publication No. 2002-64368).

An example of a memory system 1010 shown in FIG. 10 will be described.

A DSP 210 is a digital signal processing apparatus extensively used in DVD players, etc., to digitally process music data and image data and is an apparatus writing data into a memory 110 and reading data from the memory 110.

A "CLK" terminal is a terminal that loads a clock signal from the outside. The DSP 210 performs control for access to the memory 110 in synchronization with the rising edge of this clock signal. An "n_BDAA" terminal is a terminal that outputs address information indicating an address of data stored in the memory 110. An "XBDAWR" terminal is a terminal that outputs a command (write command) instructing data write to the memory 110. An "XBDARD" terminal is a terminal that outputs a command (read command) instructing data read from the memory 110. A "BDA_W" terminal is a terminal that outputs write data to the memory 110. A "BDA_R" terminal is a terminal that loads read data from the memory 110.

If a "CEN" terminal=L and a "WEN" terminal=L, the memory 110 writes the data input to a "D" terminal into an address identified by the address information at the timing of the rising edge of the clock signal input to a "/CLK" terminal. If the "CEN" terminal=L and the "WEN" terminal=H, the memory 110 outputs from a "Q" terminal the data stored at an address identified by the address information at the timing of the rising edge of the clock signal input to the "/CLK" terminal.

The memory access of the DSP 210 can be pipelined by disposing an address latch unit 500. FIGS. 11A and 11B depict how the memory access is pipelined. Since the memory access is pipelined, the DSP 210 can sequentially output the address information for each timing of rising edge of the clock signal without waiting for the completion of the data read/write process in the memory 110. This achieves fast memory access.

FIG. 12 shows a time chart when the DSP 210 reads data from the memory 110 in the memory system 1010 shown in FIG. 10.

FIG. 13 shows a time chart when data are written into the memory 110 in the memory system 1010 shown in FIG. 10.

The speedup of the memory access is achieved in the memory system 1010 by pipelining the memory access and by inputting to the memory 110 the clock signal inverted from the clock signal input to the DSP 210.

However, in the case of the data read, as shown in FIG. 12, only T1 is defined as a time interval after read data are output from the "Q" terminal of the memory 110 until the read data are loaded through the "BDA_R" terminal of the DSP 210. T1 is on the order of about ½ cycle of the clock signal. In the case of the data write, as shown in FIG. 13, only T3 is defined as a time interval after write data are output from the "BDA_W" terminal of the DSP 210 until the write data are loaded through the "D" terminal of the memory 110. T3 also is on the order of about ½ cycle of the clock signal.

This is the cause of preventing the speedup of the clock signal of the memory system 1010. That is, although values of T1 and T3 are reduced as the clock signal is speeded up, the clock signal can only be speeded up within a frequency range with T1>0 and T3>0. Therefore, the shortness of T1 and T3 becomes the cause of preventing the speedup of the clock signal and the speedup of the memory access.

SUMMARY OF THE INVENTION

In order to solve the above problems, according to a major aspect of the present invention there is provided a memory access apparatus reading data from a memory, the memory including a terminal that address information is input to, a terminal that a clock signal changing at a predetermined cycle is input to, a terminal that a read command is input to, and a terminal that outputs data stored at an address identified by the address information at a timing of the clock signal changing from one level to the other level in accordance with the read command, the memory access apparatus comprising: an address information output unit that outputs the address information and the read command at a first timing of the clock signal changing from the one level to the other level; and a read data storage unit that stores data output from the memory at a second timing after the first timing of the clock signal changing from the one level to the other level, the read data storage unit storing the data at a third timing after the second timing of the clock signal changing from the one level to the other level.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INVENTION

At least the following details will become apparent from descriptions of this specification and of the accompanying drawings.

==Overall Configuration==

Figure 1:
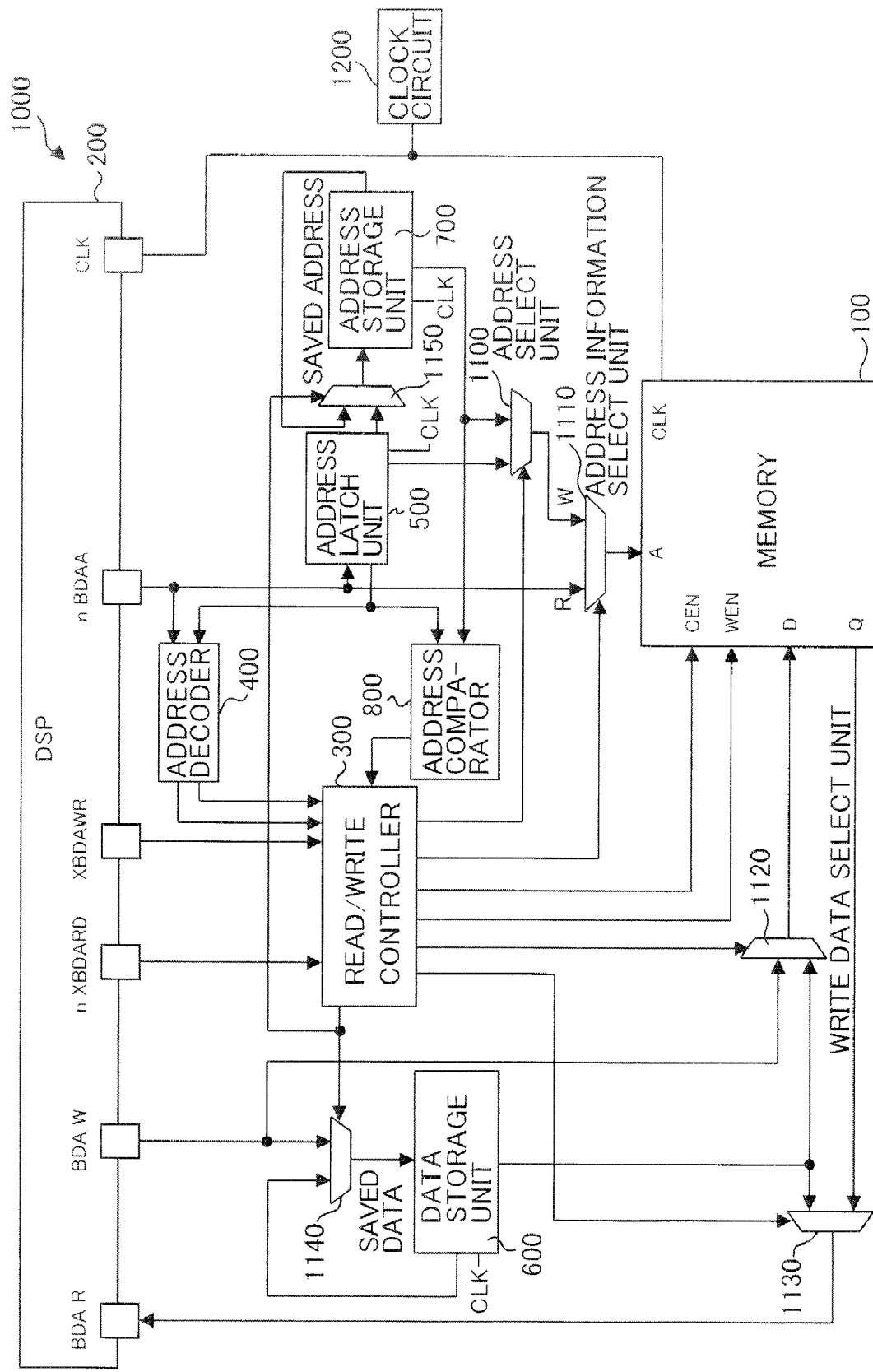
FIG. 1 depicts a memory system according to an embodiment.

FIG. 1 shows an overall configuration of a memory system 1000 according to an embodiment. The memory system 1000 is suitable for information processing devices processing various digital data, especially electronic devices processing a large amount of digital data, which are digital audio devices etc. such as DVD player or the like.

<Clock Circuit>

A clock circuit 1200 is a circuit that outputs a clock signal with a voltage changing from one level to the other level at predetermined cycles. The clock signal is input to a DSP 200, a memory 100, an address latch unit 500, an address storage unit 700, and a data storage unit 600.

<DSP>

The DSP 200 is a digital signal processing apparatus extensively used in DVD players, etc., to digitally process music data and image data, writes data into the memory 100, and reads data from the memory 100. The DSP 200 corresponds to a memory access requesting apparatus of claims.

A "CLK" terminal of the DSP 200 is a terminal that loads the clock signal. The clock signal is output from the clock circuit 1200. The DSP 200 performs control for access to the memory 100 in synchronization with the rising edge of this clock signal.

An "n_BDAA" terminal is a terminal that outputs address information indicating an address of data stored in the memory 100. The address information is output in synchronization with the rising edge of the clock signal. The address information output from the "n_BDAA" terminal is input to the address latch unit 500, an address information select unit 1110, and an address recorder 400.

An "XBDAWR" terminal is a terminal that outputs a command (write command) instructing data write to the memory 100. The write command is output in synchronization with the rising edge of the clock signal. The write command output from the "XBDAWR" terminal is input to a read/write controller 300.

An "n_XBDARD" terminal is a terminal that outputs a command (read command) instructing data read from the memory 100. The read command is output in synchronization with the rising edge of the clock signal. The read command output from the "n_XBDARD" terminal is input to the read/write controller 300.

A "BDA_W" terminal is a terminal that outputs write data to the memory 100. The write data are output in synchronization with the rising edge of the clock signal. The write data output from the "BDA_W" terminal is input to a write data select unit 1120 or a data storage select unit 1140.

A "BDA_R" terminal is a terminal that loads read data from the memory 100. The read data are loaded in synchronization with the rising edge of the clock signal. The read data are loaded from the data storage unit 600 or the memory 100 through a read data select unit 1130.

<Memory>

A "CLK" terminal of the memory 100 is a terminal that loads a clock signal from the outside. The clock signal input to the memory 100 is the same as the clock signal input to the DSP 200. The memory 100 controls the data read or write in synchronization with the rising edge of the clock signal. That is, the DSP 200 and the memory 100 perform control in synchronization with the rising edge of the clock signal having the same phase.

An "A" terminal is a terminal that the address information of data stored in the memory 100 is input to. The address information output from the address information select unit 1110 is input to the "A" terminal.

A "CEN" terminal is a terminal that a chip enable signal is input to. The chip enable signal is output from the read/write controller 300.

A "WEN" terminal is a terminal that a write enable signal is input to. The write enable signal is also output from the read/write controller 300.

The chip enable signal and the write enable signal configure a read command and a write command of claims. That is, specifically, a combination of the chip enable signal=L and the write enable signal=L corresponds to the write command, and a combination of the chip enable signal=L and the write enable signal=H corresponds to the read command.

A "D" terminal is a terminal that write data to the memory 100 is input to. If the "CEN" terminal=L and the "WEN" terminal=L, the write data input to the "D" terminal are stored at an address identified by the address information input to the "A" terminal, in synchronization with the rising edge of the clock signal. The write data are input from the DSP 200 or the data storage unit 600 through the write data select unit 1120.

A "Q" terminal is a terminal that outputs read data from the memory 100. If the "CEN" terminal=L and the "WEN" terminal=H, the memory 110 outputs from the "Q" terminal the data stored at an address identified by the address information input to the "A" terminal, in synchronization with the rising edge of the clock signal. The read data are input through the read data select unit 1130 to the DSP 200.

<Address Latch Unit>

The same clock signal as the clock signal input to the DSP 200 is input to the address latch unit 500, and the address latch unit 500 is a circuit that loads the address information output from the DSP to output the address information after latching for one cycle of the clock signal. The address latch unit 500 outputs the address information to an address select unit 1100, the address recorder 400, an address storage select unit 1150, and an address comparator 800. The memory access of the DSP 200 can be pipelined by disposing the address latch unit 500.

<Address Recorder>

The address recorder 400 is a circuit that decodes the address information stored in the address latch unit 500 and the address information output from the "n_BDAA" terminal of the DSP 200 to output the information to the read/write controller 300.

<Address Storage Unit>

The address storage unit 700 is a circuit that stores the address information output from the address latch unit 500. The address information stored in the address storage unit 700 is output to the address select unit 1100. The address information output from the address latch unit 500 is input to the address storage unit 700 through the address storage select unit 1150.

<Address Storage Select Unit>

The address storage select unit 1150 is a circuit that outputs either the address information output from the address latch unit 500 or the address information output from the address storage unit 700 in accordance with an address storage signal output from the read/write controller 300.

<Address Select Unit>

The address select unit 1100 is a circuit that outputs either the address information output from the address latch unit 500 or the address information from the address storage unit 700 in accordance with an address select signal output from the read/write controller 300. The address information output from the address select unit 1100 is input to the address information select unit 1110.

<Address Information Select Unit>

The address information select unit 1110 is a circuit that outputs either the address information output from the "n_BDAA" terminal of the DSP 200 or the address information output from the address select unit 1100 in accordance with a read/write select signal output from the read/write controller 300. The address information output from the address information select unit 1110 is input to the "A" terminal of the memory 100.

<Address Comparator>

The address comparator 800 is a circuit that compares the address information output from the address latch unit 500 and the address information output from the address storage unit 700 to output to the read/write controller 300 a signal indicting whether these pieces of the address information are the same.

<Data Storage Unit>

The data storage unit 600 is a circuit that loads and stores the write data output from the DSP 200. The write data stored in the data storage unit 600 are input to the write data select unit 1120 and the read data select unit 1130 and are output to the memory 100 or the DSP 200 in accordance with a write data select signal or read data select signal output from the read/write controller 300. The write data output from the DSP 200 are input to the data storage unit 600 through the data storage select unit 1140.

<Data Storage Select Unit>

The data storage select unit 1140 is a circuit that outputs either the write data output from the DSP 200 or the write data output from the data storage unit 600 in accordance with a write data storage signal output from the read/write controller 300.

<Read/Write Controller>

The read/write controller 300 is a circuit that controls memory access performed in the memory system 1000. For example, the chip enable signal and the write enable signal are output to the memory 100 in accordance with the read command and write command output from the DSP 200. The details will be described later.

==Read Control==

Figure 2:
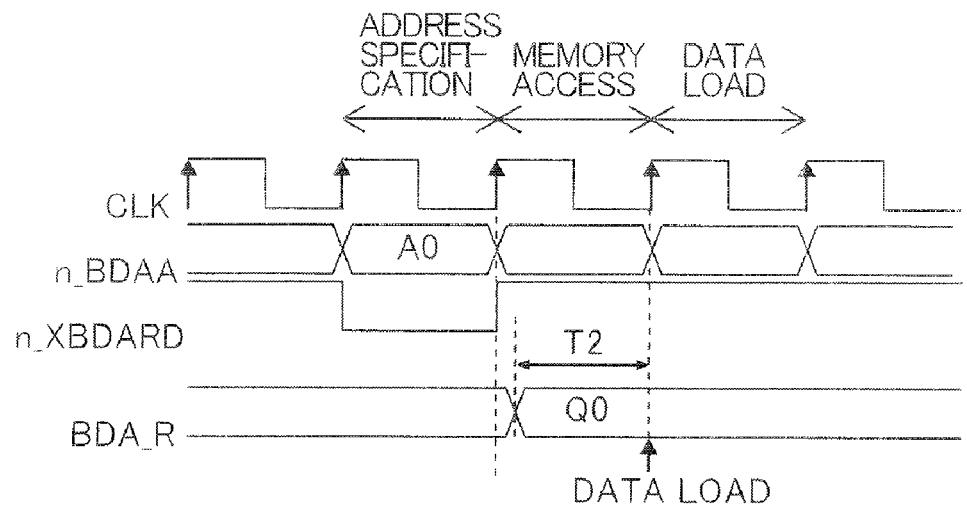
FIG. 2 depicts a time chart when data are read in the memory system according to an embodiment.

FIG. 2 shows a time chart when the DSP 200 reads data from the memory 100 in the memory system 1000 according to an embodiment.

As shown in FIG. 2, the DSP 200 according to an embodiment outputs the read command from the "n_XBDARD" terminal at the timing of outputting the address information from the "n_BDAA" terminal.

On the other hand, the read/write controller 300 outputs to the address information select unit 1110 the read/write select signal selecting the address information output from the "n_BDAA" terminal of the DSP 200 in accordance with the read command from the DSP 200. As a result, the address information output from the "n_BDAA" terminal is input to the "A" terminal of the memory 100.

The read/write controller 300 also outputs the chip enable signal=L and the write enable signal=H (read command) to the memory 100 in accordance with the read command from the DSP 200.

Since this leads to the "CEN" terminal=L and the "WEN" terminal=H in the memory 100, the memory 100 outputs from the "Q" terminal the data stored at an address identified by the address information input to the "A" terminal in synchronization with the next rising edge of the clock signal (i.e., after one cycle from the output of the read command of the DSP 200).

The read/write controller 300 outputs to the read data select unit 1130 the read data select signal selecting the data output from the memory 100 in accordance with the read command from the DSP 200.

As a result, the read data output from the "Q" terminal of the memory 100 are input to the "BDA_R" terminal of the DSP 200.

The DSP 200 stores the read data input to the "BDA_R" terminal in synchronization with the next rising edge of the clock signal (i.e., after one cycle from the timing of outputting the read command from the memory 100).

In the memory system 1000 according to an embodiment, T2 is defined as a time interval after the read data are output from the "Q" terminal of the memory 100 until the read data are stored through the "BDA_R" terminal of the DSP 200. T2 is on the order of about one cycle of the clock signal. Since the time interval after the read data are output from the memory 100 until the read data are stored in the DSP 200 can be elongated, the clock signal can be speeded up.

==Write Control==

Figure 3:
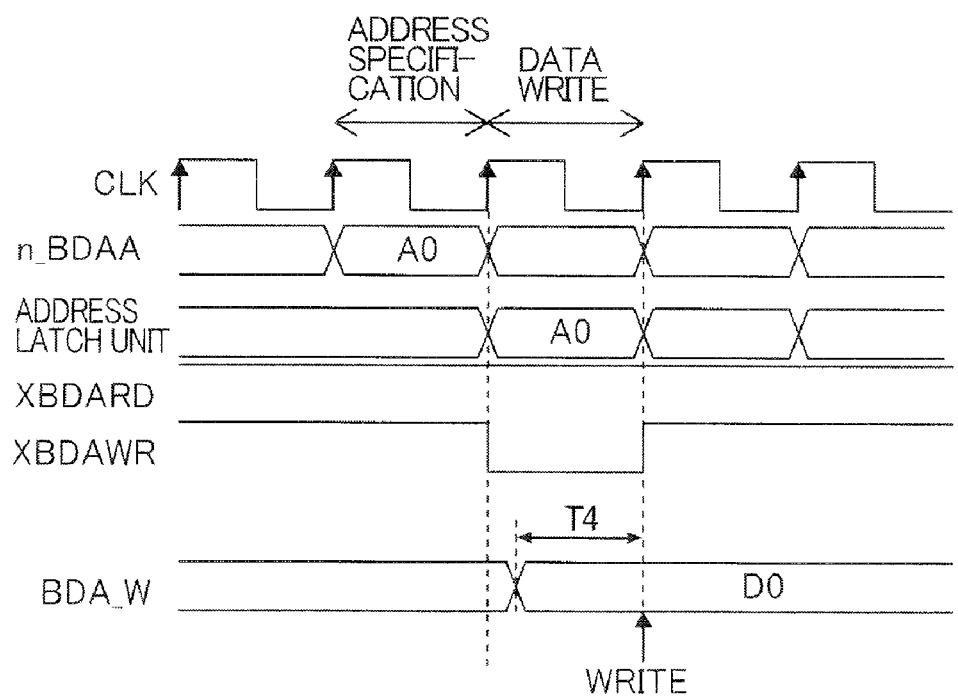
FIG. 3 depicts a time chart when data are written in the memory system according to an embodiment.

FIG. 3 shows a time chart when the DSP 200 writes data into the memory 100 in the memory system 1000 according to an embodiment.

As shown in FIG. 3, the DSP 200 according to an embodiment outputs the write command from the "XBDAWR" terminal to output the write data from the "BDA_W" terminal at the next timing after the timing of outputting the address information from the "n_BDAA" terminal.

On the other hand, the read/write controller 300 outputs to the address select unit 1100 the address select signal selecting the address information output from the address latch unit 500 and outputs to the address information select unit 1110 the read/write select signal selecting the address information output from the address select unit 1100 in accordance with the write command from the DSP 200. As a result, the address information output from the address latch unit 500 is input to the "A" terminal of the memory 100. The read/write controller 300 outputs to the write data select unit 1120 the write data select signal selecting the write data output from the DSP 200 in accordance with the write command from the DSP 200. As a result, the write data from the DSP 200 are input to the "D" terminal of the memory 100.

The read/write controller 300 also outputs the chip enable signal=L and the write enable signal=L (write command) to the memory 100 in accordance with the write command from the DSP 200.

The read/write controller 300 also outputs the chip enable signal=L and the write enable signal=H (read command) to the memory 100 in accordance with the read command from the DSP 200.

Since this leads to the "CEN" terminal=L and the "WEN" terminal=L, the memory 100 stores the write data input to the "D" terminal at an address identified by the address information input to the "A" terminal in synchronization with the next rising edge of the clock signal (i.e., after one cycle from the output of the write command of the DSP 200).

In the memory system 1000 according to an embodiment, T4 is defined as a time interval after the write data are input to the "D" terminal of the memory 100 until the write data are stored. T4 is on the order of about one cycle of the clock signal.

Since the clock signal input to the memory 100 and the clock signal input to the DSP 200 have the same phase and the write data are output from the DSP 200 at the timing earlier by one cycle than the timing of storing the write data into the memory 100, the time interval after the write data are output from the DSP 200 until the write data are loaded in the memory 100 can be elongated. Therefore, the clock signal can be speeded up.

==Read Priority Control==

Read priority control according to an embodiment will be described. The read priority control is control giving priority to a read process when the read timing and write timing of data are overlapped in the memory 100.

As described above, in the memory system 1000, a time interval of one cycle of the clock signal exists after the address information of the read data is output from the DSP 200 until the read data are output from the memory 100, and a time interval of two cycles of the clock signal exists after the address information of the write data is output from the DSP 200 until the write data are stored in the memory 100. Therefore, even when the DSP 200 outputs the address information of the read data and the address information of the write data at different timings, the read timing and write timing of data may be matched in the memory 100.

Therefore, based on the timing of outputting the read command and the timing of outputting the write command from the DSP 200, the read/write controller 300 detects the overlap of the data read from the memory 100 and the data write to the memory 100 in advance to perform control for avoiding the overlap.

Figure 4:
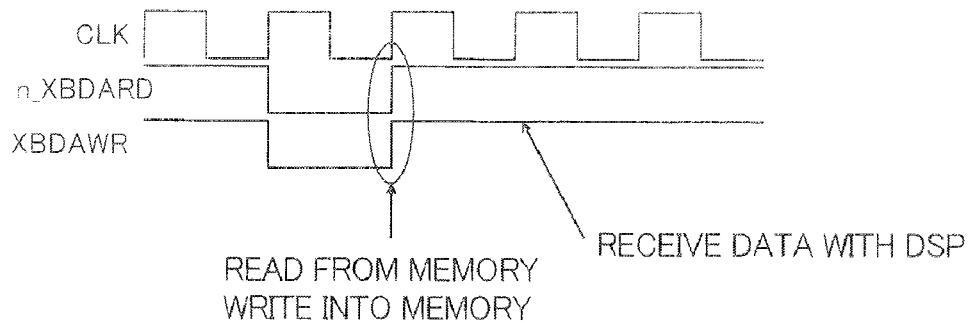
FIG. 4 depicts a case that data read and write are overlapped.

Specifically, as shown in FIG. 4, the read/write controller 300 detects that both the read command output from the "n_XBDARD" terminal of the DSP 200 and the write command output from the "XBDAWR" terminal are input at the same time to detect in advance that the timing of the data read from the memory 110 and the timing of the data write to the memory 100 are overlapped.

The details will be described based on a specific example.

<When Write and Read are Alternated>

Figure 5A:
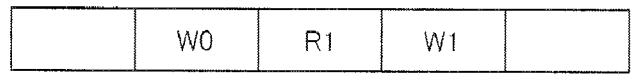
FIG. 5A depicts a specific example of the case that data read and write are overlapped.

If the DSP 200 attempts to consecutively perform data write (W0), data read (R1), and data write (W1) as shown in FIG. 5A, the data read and write are overlapped in the memory 100. The read priority control performed in this case will be described with reference to a time chart of FIG. 6.

For simplicity of description, the data write and read are identified by "Wi" (i is an integer number) and "Rj" (j is an integer number), respectively. In the case of the data write (Wi), WAi indicates an address of the memory 100 at which the data are written. The data written into the memory 100 is represented by Di. Similarly, in the case of the data read (Rj), RAj indicates an address of the memory 100 at which the data are stored. The data read from the memory 100 is represented by Qj.

Figure 6:
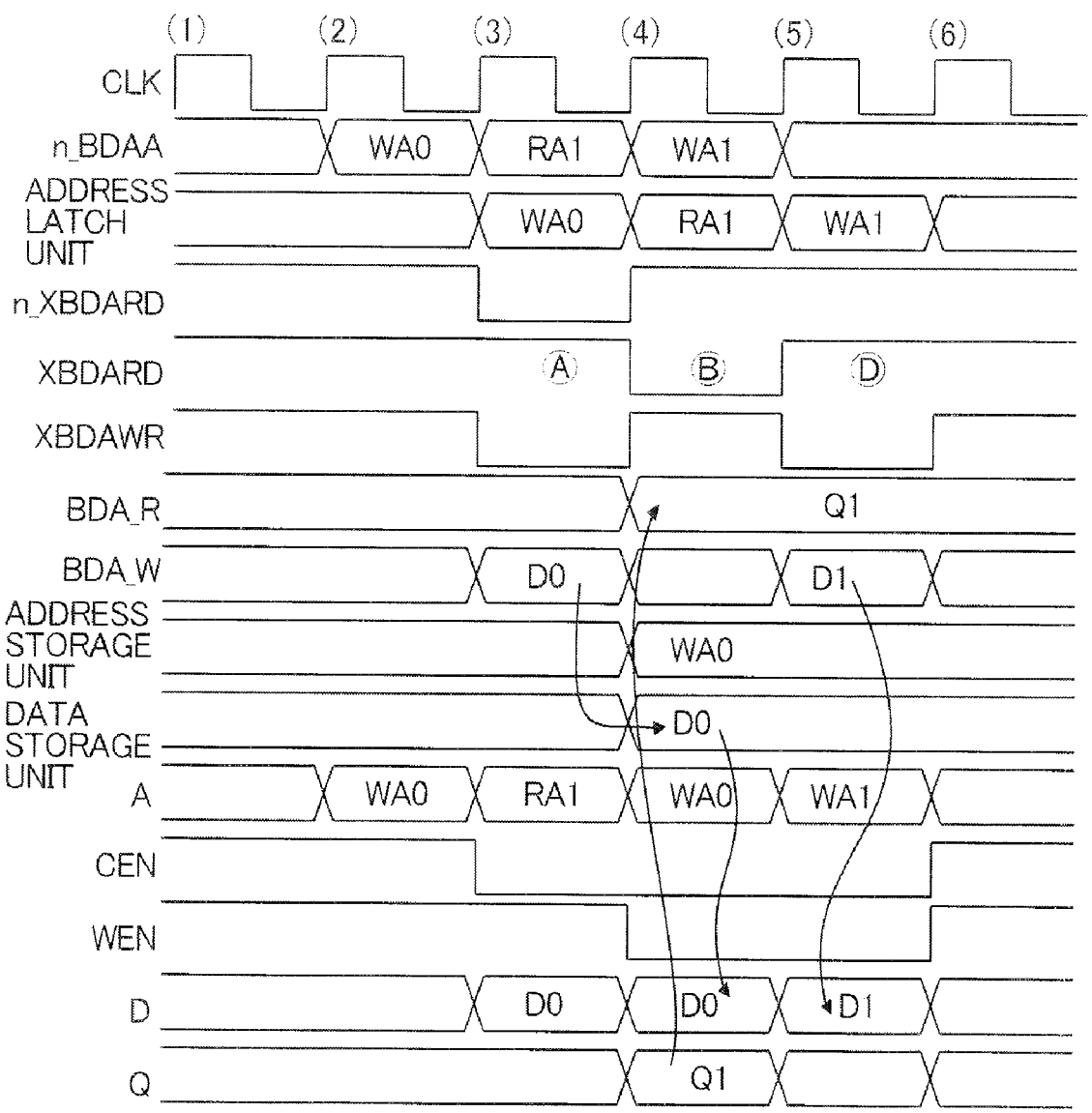
FIG. 6 depicts a time chart when data write and read are alternated.

In the time chart of FIG. 6, at the timing of (2) of the clock signal, the DSP 200 outputs address information (WA0) of write data from the "n_BDAA" terminal. The DSP 200 outputs address information (RA1) of read data at the timing (3) of the next rising edge of the clock signal. The DSP 200 outputs address information (WA1) of write data at the timing (4) of the next rising edge of the clock signal.

These pieces of the address information are output from the address latch unit 500 at intervals of one clock cycle.

The DSP 200 outputs the write command from the "XBDAWR" terminal at the next timing (3) after outputting the address information WA0. On the other hand, the DSP 200 outputs the read command from the "n_XBDARD" terminal at the timing (3) of outputting the address information RA1.

The read/write controller 300 detects that both the read command and the write command are output from the DSP 200 (condition A).

As a result, the read/write controller 300 outputs the write data storage signal to the data storage select unit 1140 to store write data (D0) output from the "BDA_W" terminal of the DSP 200 into the data storage unit 600. Therefore, the write data (D0) are not written into the memory 100 and are stored into the data storage unit 600.

The read/write controller 300 outputs the address storage signal to the address storage select unit 1150 to store address information (WA0) stored in the address latch unit 500 into the address storage unit 700. Therefore, the address information (WA0) is stored into the address storage unit 700.

The read/write controller 300 outputs to the address information select unit 1110 the read/write select signal selecting the address information output from the "n_BDAA" terminal of the DSP 200. Therefore, the address information (RA1) output from the "n_BDAA" terminal is directly input to the "A" terminal of the memory 100.

The read/write controller 300 also outputs the chip enable signal=L and the write enable signal=H (read command) to the memory 100.

Since this leads to the "CEN" terminal=L and the "WEN" terminal=H, the memory 100 outputs from the "Q" terminal the data (Q1) stored at an address identified by the address information input to the "A" terminal at the timing (4) of the next rising edge of the clock signal.

The read/write controller 300 outputs to the read data select unit 1130 the read data select signal selecting the data output from the memory 100.

As a result, the read data (Q1) from the memory 100 are input to the "BDA_R" terminal of the DSP 200. The read data (Q1) are stored into the DSP 200 at the timing (5) of the next rising edge of the clock signal.

On the other hand, the DSP 200 outputs neither the read command nor the write command at the timing (4) of the clock signal (condition B). Therefore, the read/write controller 300 performs a process for writing the write data (D0) stored in the data storage unit 600 into the memory 100.

That is, the read/write controller 300 outputs to the write data select unit 1120 the write data select signal for outputting the write data from the data storage unit 600 and outputs to the address select unit 1100 the address select signal for selecting the address information stored in the address storage unit 700. The read/write controller 300 further outputs to the address information select unit 1110 the read/write select signal for selecting the address information output from the address select unit 1100.

The read/write controller 300 outputs the chip enable signal=L and the write enable signal=L (write command) to the memory 100. As a result, the write data (D0) stored in the data storage unit 600 are stored into the memory 100 at the timing (5) of the next rising edge of the clock signal.

On the other hand, the DSP 200 outputs the write data (D1) from the "BDA_W" terminal and outputs the write command from the "XBDAWR" terminal at the timing of (5) of the clock signal.

The read/write controller 300 detects that only the write command is output from the DSP 200 (condition D). In this case, the read/write controller 300 outputs to the address select unit 1100 the address select signal selecting the address information output from the address latch unit 500 and outputs to the address information select unit 1110 the read/write select signal selecting the address information output from the address select unit 1100. As a result, the address information output from the address latch unit 500 is input to the "A" terminal of the memory 100.

The read/write controller 300 outputs to the write data select unit 1120 the write data select signal selecting the write data (D1) output from the DSP 200. As a result, the write data from the DSP 200 are input to the "D" terminal of the memory 100.

The read/write controller 300 outputs the chip enable signal=L and the write enable signal=L (write command) to the memory 100.

As a result, the memory 100 stores the write data (D1) input to the "D" terminal at an address identified by the address information input to the "A" terminal at the timing (6) of the next rising edge of the clock signal.

Since the read process can be continued even if the timing of the data read from the memory 100 is overlapped with the write timing, the data read process can be prevented from being delayed. Since the read data are quickly supplied to the DSP 200, the speedup can further be achieved in the data process of the entire memory system 1000 and therefore the entire DVD player.

<When Read is Continued after Write>

Figure 5B:
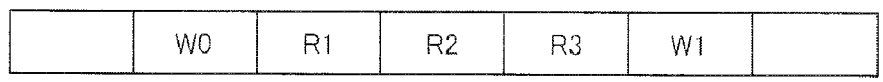
FIG. 5B depicts a specific example of the case that data read and write are overlapped.

Description will be made of a case that the data write (W1) is performed after the data read (R1, R2, and R3) is continued following the data write (W0) as shown in FIG. 5B. The read priority control performed in this case will be described with reference to a time chart of FIG. 7.

Figure 7:
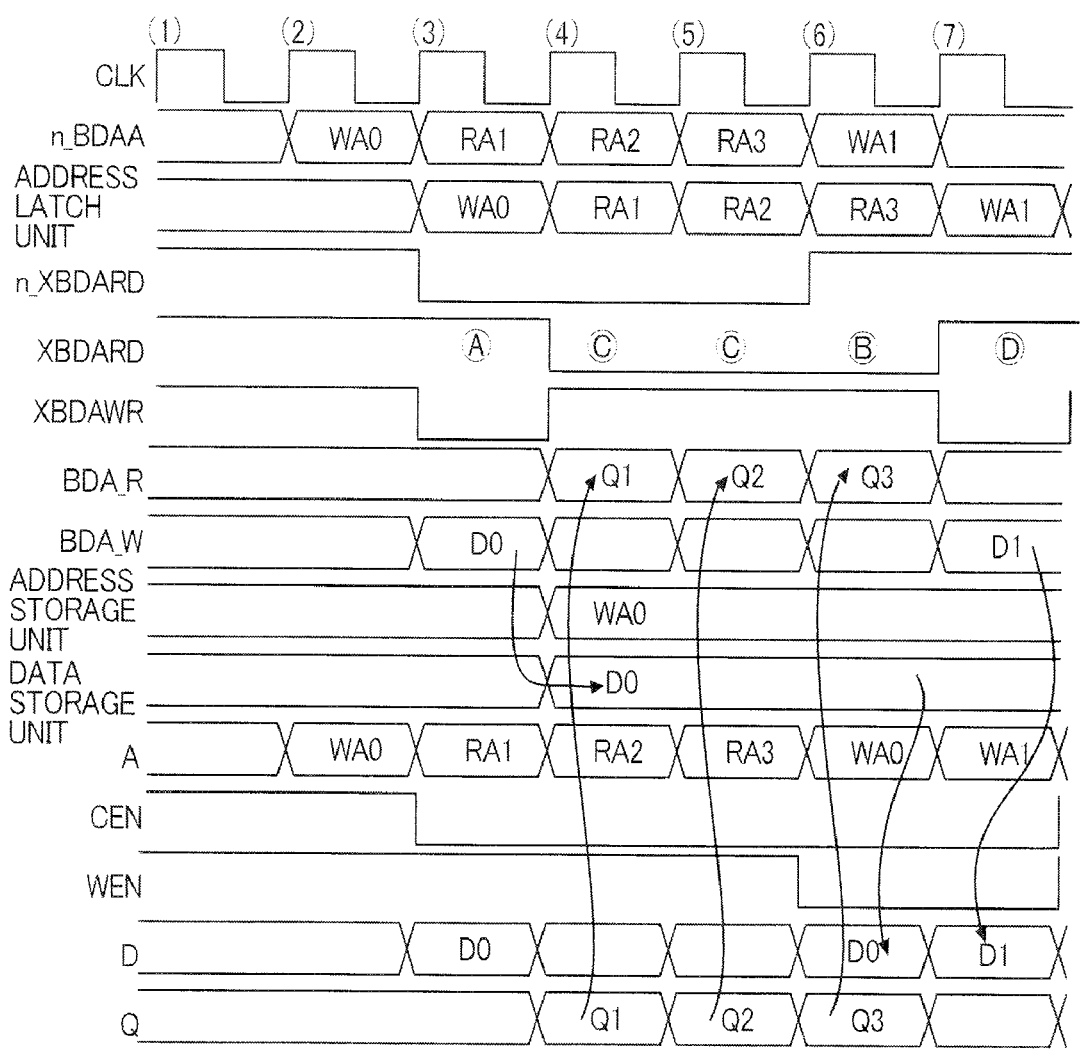
FIG. 7 depicts a time chart when read is successively performed after data write.

At the timing of (2) of the clock signal shown in FIG. 7, the DSP 200 outputs the address information (WA0) of write data from the "n_BDAA" terminal. The DSP 200 outputs the address information (RA1) of read data at the timing (3) of the next rising edge of the clock signal. The address information RA2, RA3, WA1 is then sequentially output.

These pieces of the address information are output from the address latch unit 500 at intervals of one clock cycle.

The DSP 200 outputs the write command from the "XBDAWR" terminal at the next timing (3) after outputting the address information WA0. On the other hand, the DSP 200 outputs the read command from the "n_XBDARD" terminal at the timing (3) of outputting the address information RA1.

The read/write controller 300 detects that both the read command and the write command are output from the DSP 200 (condition A).

As a result, the read/write controller 300 outputs the write data storage signal to the data storage select unit 1140 to store the write data (D0) output from the "BDA_W" terminal of the DSP 200 into the data storage unit 600. Therefore, the write data (D0) are stored into the data storage unit 600.

The read/write controller 300 outputs the address storage signal to the address storage select unit 1150 to store address information (WA0) stored in the address latch unit 500 into the address storage unit 700. Therefore, the address information (WA0) is stored into the address storage unit 700.

The read/write controller 300 outputs to the address information select unit 1110 the read/write select signal selecting the address information output from the "n_BDAA" terminal of the DSP 200. Therefore, the address information (RA1) output from the "n_BDAA" terminal is directly input to the "A" terminal of the memory 100.

The read/write controller 300 also outputs the chip enable signal=L and the write enable signal=H (read command) to the memory 100.

Since this leads to the "CEN" terminal=L and the "WEN" terminal=H, the memory 100 outputs from the "Q" terminal the data (Q1) stored at an address identified by the address information input to the "A" terminal at the timing (4) of the next rising edge of the clock signal.

The read/write controller 300 outputs to the read data select unit 1130 the read data select signal selecting the data output from the memory 100.

As a result, the read data (Q1) from the memory 100 are input to the "BDA_R" terminal of the DSP 200. The read data (Q1) are stored into the DSP 200 at the timing (5) of the next rising edge of the clock signal.

On the other hand, at the timing of (4) of the clock signal, the DSP 200 outputs the read command from the "n_XBDARD" terminal at the timing of outputting the address information (RA2) from the "n_BDAA" terminal.

The read/write controller 300 detects that only the read command is output from the DSP 200 (condition C) and outputs to the address information select unit 1110 the read/write select signal selecting the address information (RA2) output from the "n_BDAA" terminal of the DSP 200. As a result, the address information output from the "n_BDAA" terminal is directly input to the "A" terminal of the memory 100.

The read/write controller 300 also outputs the chip enable signal=L and the write enable signal=H (read command) to the memory 100.

As a result, the memory 100 outputs from the "Q" terminal the data (Q2) stored at an address identified by the address information (RA2) input to the "A" terminal at the timing (5) of the next rising edge of the clock signal.

The read/write controller 300 outputs to the read data select unit 1130 the read data select signal selecting the data output from the memory 100.

As a result, the read data (Q2) from the memory 100 are input to the "BDA_R" terminal of the DSP 200. The read data (Q2) are stored into the DSP 200 at the timing (6) of the next rising edge of the clock signal.

If the data read (R1, R2, . . . ) is continued, the data read is prioritized, and the write data (D0) stored in the data storage unit 600 remains stored.

Subsequent steps of FIG. 7 are the same as the case described in detail with reference to FIG. 6. That is, when the DSP 200 outputs neither the read command nor the write command at the timing of (6) of the clock signal in FIG. 7, the write data (D0) stored in the data storage unit 600 are written into the memory 100.

In this way, if the timing of the data read from the memory 100 is overlapped with the write timing, the read process can be prioritized to prevent the data read process from being delayed. Since the read data can quickly be supplied to the DSP 200, the speedup can further be achieved in the data process of the entire memory system 1000 and the entire DVD player.

==Control of Reading Write Data Stored in Data Storage Unit==

Figure 5C:
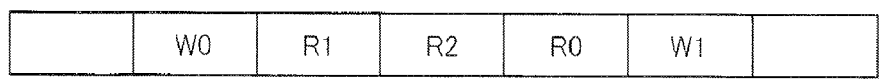
FIG. 5C depicts a specific example of the case that data read and write are overlapped.

Control of reading write data stored in the data storage unit 600 will be described. Description will be made of a case that the data write (W1) is performed after the data read (R1, R2, and R0) is continued following the data write (W0) as shown in FIG. 5C. R0 represents that the data written in W0 are read. The control performed in this case will be described with reference to a time chart of FIG. 8.

Figure 8:
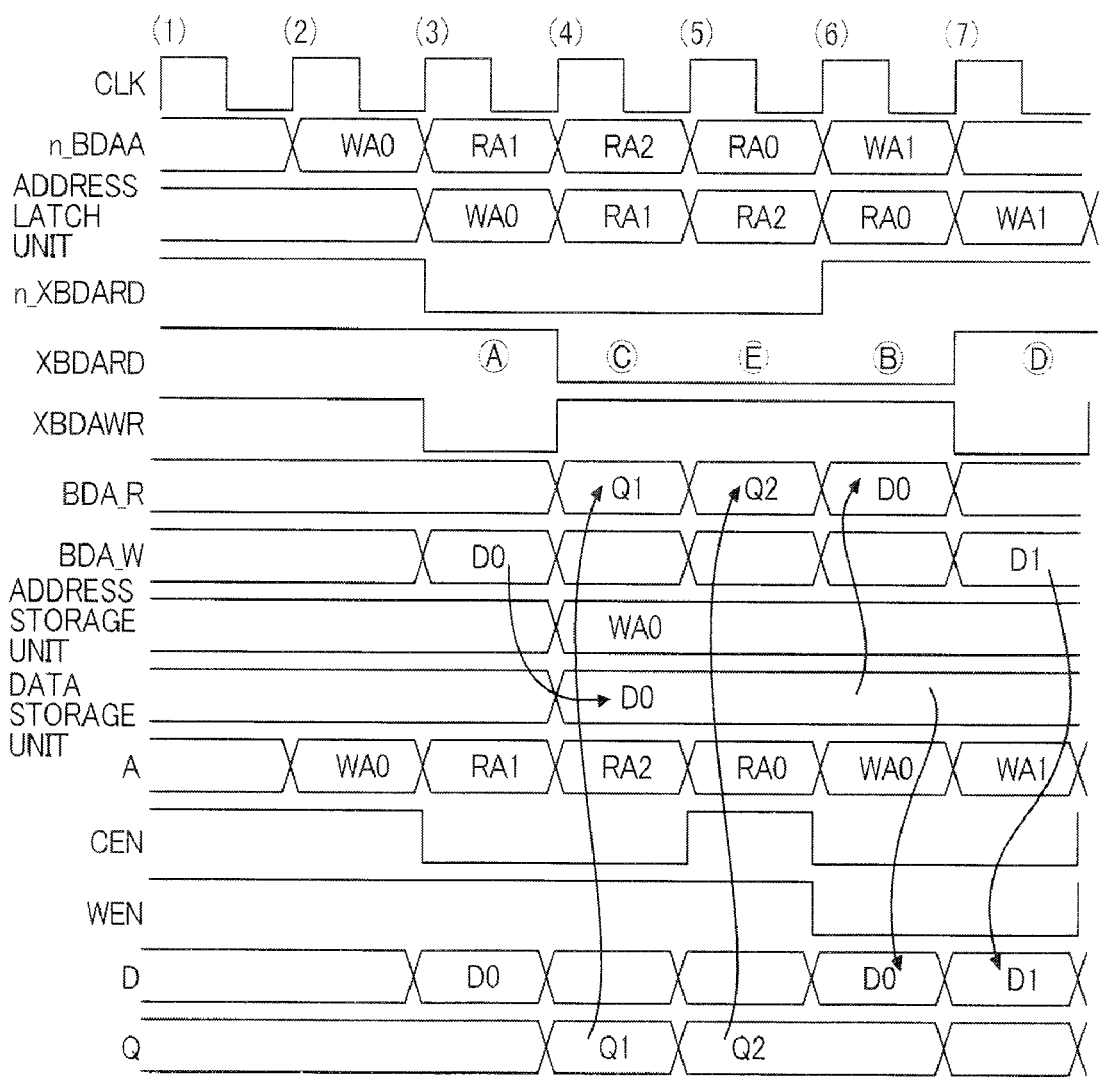
FIG. 8 depicts a time chart when data stored in a data storage unit are read.

At the timing of (2) of the clock signal shown in FIG. 8, the DSP 200 outputs the address information (WA0) of write data from the "n_BDAA" terminal. The DSP 200 outputs the address information (RA1) of read data at the timing (3) of the next rising edge of the clock signal. The address information RA2, RA0, WA1 is then sequentially output. RA0 is the same address information as WA0.

These pieces of the address information are output from the address latch unit 500 at intervals of one clock cycle.

The DSP 200 outputs the write command from the "XBDAWR" terminal at the next timing (3) after outputting the address information WA0. On the other hand, the DSP 200 outputs the read command from the "n_XBDARD" terminal at the timing (3) of outputting the address information RA1.

The read/write controller 300 detects that both the read command and the write command are output from the DSP 200 (condition A).

As a result, the read/write controller 300 outputs the write data storage signal to the data storage select unit 1140 to store the write data (D0) output from the "BDA_W" terminal of the DSP 200 into the data storage unit 600. Therefore, the write data (D0) are stored into the data storage unit 600.

The read/write controller 300 outputs the address storage signal to the address storage select unit 1150 to store address information (WA0) stored in the address latch unit 500 into the address storage unit 700. Therefore, the address information (WA0) is stored into the address storage unit 700.

The read/write controller 300 outputs to the address information select unit 1110 the read/write select signal selecting the address information output from the "n_BDAA" terminal of the DSP 200. Therefore, the address information (RA1) output from the "n_BDAA" terminal is directly input to the "A" terminal of the memory 100.

The read/write controller 300 also outputs the chip enable signal=L and the write enable signal=H (read command) to the memory 100.

Since this leads to the "CEN" terminal=L and the "WEN" terminal=H, the memory 100 outputs from the "Q" terminal the data (Q1) stored at an address identified by the address information input to the "A" terminal at the timing (4) of the next rising edge of the clock signal.

The read/write controller 300 outputs to the read data select unit 1130 the read data select signal selecting the data output from the memory 100.

As a result, the read data (Q1) from the memory 100 are input to the "BDA_R" terminal of the DSP 200. The read data (Q1) are stored into the DSP 200 at the timing (5) of the next rising edge of the clock signal.

On the other hand, at the timing of (4) of the clock signal, the DSP 200 outputs the read command from the "n_XBDARD" terminal at the timing of outputting the address information (RA2) from the "n_BDAA" terminal.

The read/write controller 300 detects that only the read command is output from the DSP 200 (condition C) and outputs to the address information select unit 1110 the read/write select signal selecting the address information (RA2) output from the "n_BDAA" terminal of the DSP 200. As a result, the address information (RA2) output from the "n_BDAA" terminal is directly input to the "A" terminal of the memory 100.

The read/write controller 300 also outputs the chip enable signal=L and the write enable signal=H (read command) to the memory 100.

As a result, the memory 100 outputs from the "Q" terminal the data (Q2) stored at an address identified by the address information (RA2) input to the "A" terminal at the timing (5) of the next rising edge of the clock signal.

The read/write controller 300 outputs to the read data select unit 1130 the read data select signal selecting the data output from the memory 100.

As a result, the read data (Q2) from the memory 100 are input to the "BDA_R" terminal of the DSP 200. The read data (Q2) are stored into the DSP 200 at the timing (6) of the next rising edge of the clock signal.

At the timing of (5) of the clock signal, the DSP 200 then outputs the read command from the "n_XBDARD" terminal at the timing of outputting the address information (RA0) from the "n_BDAA" terminal.

By the way, the address information (RA0) output from the "n_BDAA" terminal is output from the address latch circuit 500 at the timing of (6) of the clock signal and is input to the address comparator 800. The address information (WA0) stored in the address storage unit 700 is also input to the address comparator 800. Since RA0 and WA0 are the same as described above, the address comparator 800 outputs to the read/write controller 300 the information indicating that these pieces of address information are identical.

The read/write controller 300 detects the read command from the DSP 200 and the above information from the address comparator 800 (condition E). In this case, the DSP 200 outputs to the read data select unit 1130 the read data select signal selecting the data stored in the data storage unit 600 at the timing of (6) of the clock signal.

As a result, the data (D0) stored in the data storage unit 600 are input to the "BDA_R" terminal of the DSP 200. The data (D0) are stored in the DSP 200 at the timing (7) of the next rising edge of the clock signal.

In this way, if the data of the read request from the DSP 200 are stored in the data storage unit 600, the data can be supplied to the DSP 200 without a process of reading the data from the memory 100. Therefore, the data read can be performed at high speed.

By the way, the DSP 200 outputs neither the read command nor the write command at the timing of (6) of the clock signal (condition B). Therefore, the read/write controller 300 performs a process for writing the write data (D0) stored in the data storage unit 600 into the memory 100.

The read/write controller 300 outputs to the write data select unit 1120 the write data select signal for outputting the write data from the data storage unit 600 and outputs to the address select unit 1100 the address select signal for selecting the address information stored in the address storage unit 700. The read/write controller 300 further outputs to the address information select unit 1110 the read/write select signal for selecting the address information output from the address select unit 1100.

The read/write controller 300 outputs to the write data select unit 1120 the write data select signal for outputting the write data from the data storage unit 600 and outputs to the address select unit 1100 the address select signal for selecting the address information stored in the address storage unit 700. The read/write controller 300 further outputs to the address information select unit 1110 the read/write select signal for selecting the address information output from the address select unit 1100.

The read/write controller 300 outputs the chip enable signal=L and the write enable signal=L (write command) to the memory 100. As a result, the write data (D0) stored in the data storage unit 600 are stored into the memory 100 at the timing (7) of the next rising edge of the clock signal.

Subsequent steps are the same as the case described in detail with reference to FIG. 6. That is, at the timing of (7) of the clock signal of FIG. 8, it is detected that the DSP 200 outputs only the write command, and the write data (D1) output from the DSP 200 are written into the memory 100.

In this way, if the timing of the data read from the memory 100 is overlapped with the write timing, the read process can be prioritized to prevent the data read process from being delayed. Since the read data can quickly be supplied to the DSP 200, the speedup can further be achieved in the data process of the entire memory system 1000. If the read data are stored in the data storage unit 600, the data can be read from the data storage unit 600 rather than the memory 100 to supply the read data to the DSP 200 at an earlier timing.

The above embodiments of the present invention are simply for facilitating the understanding of the present invention and are not in any way to be construed as limiting the present invention. The present invention may variously be changed or altered without departing from its spirit and encompass equivalents thereof.

Figure 9:
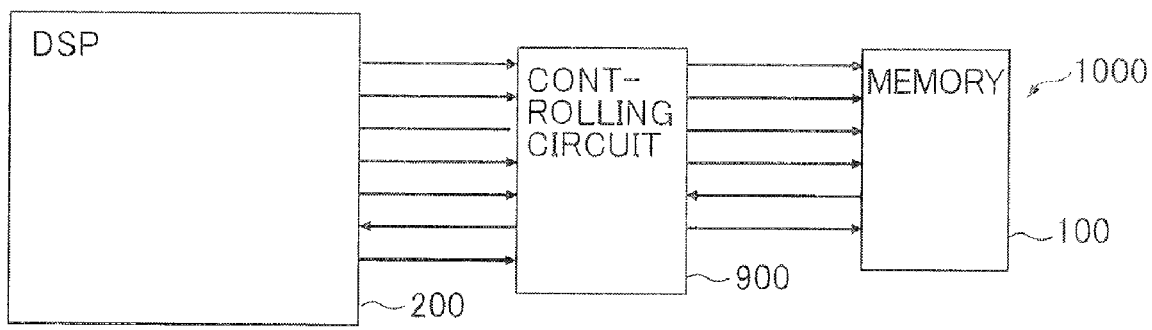
FIG. 9 depicts the memory system according to an embodiment.
Figure 10:
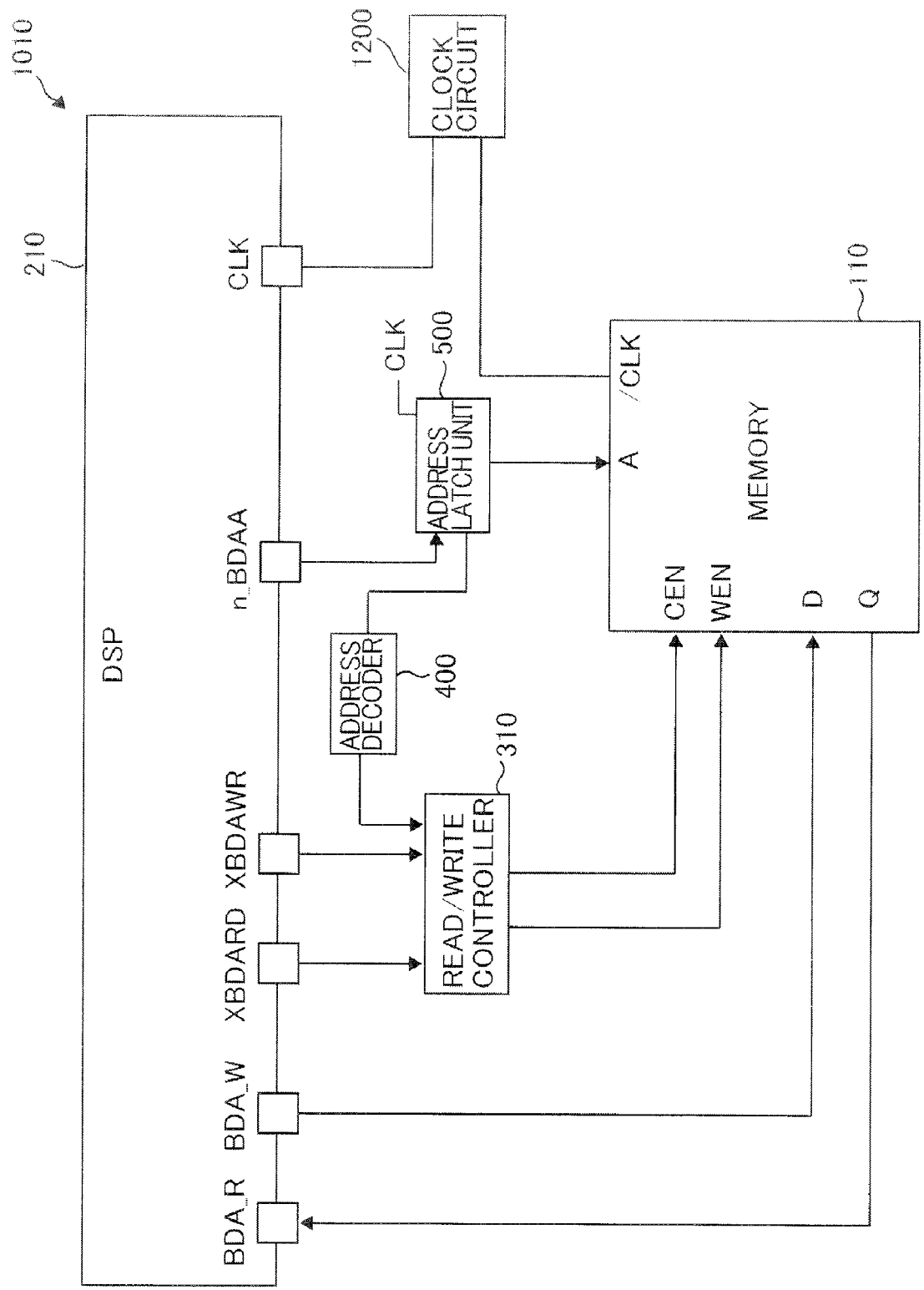
FIG. 10 depicts a memory system.
Figure 11A:
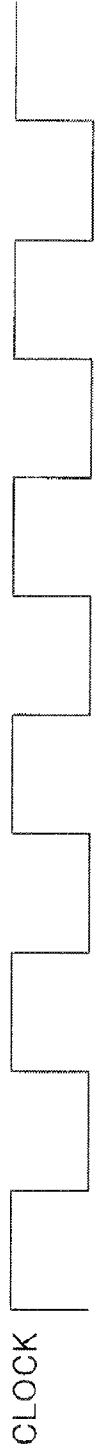
FIG. 11A depicts pipeline control of memory access.
Figure 11B:
FIG. 11B depicts pipeline control of memory access.
Figure 12:
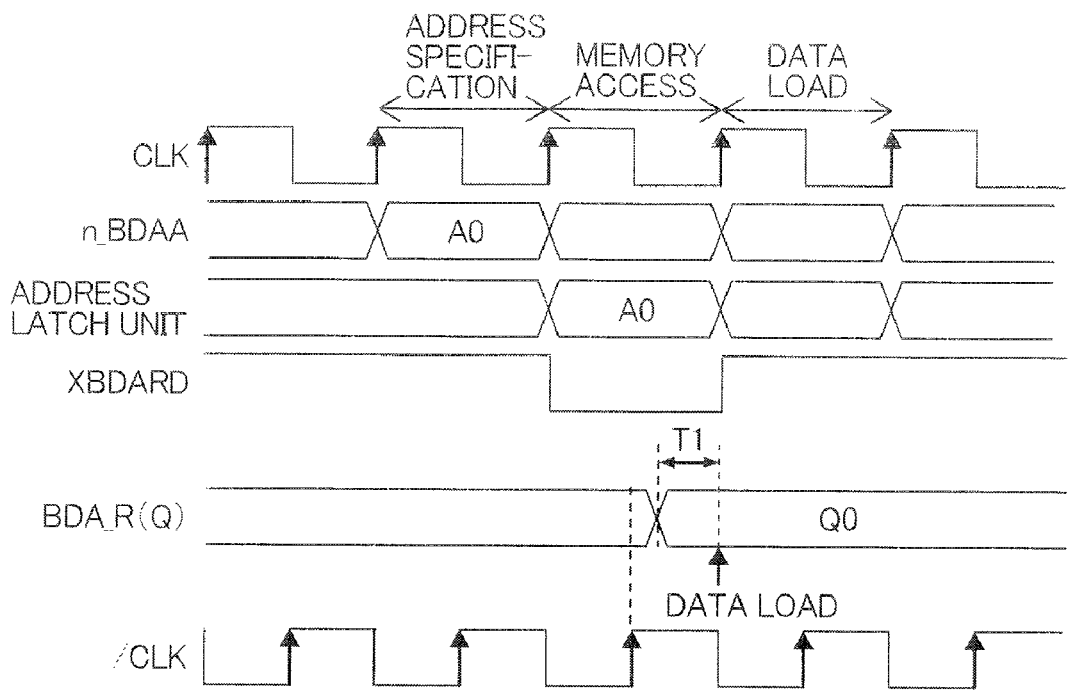
FIG. 12 depicts a time chart when data are read in the memory system.
Figure 13:
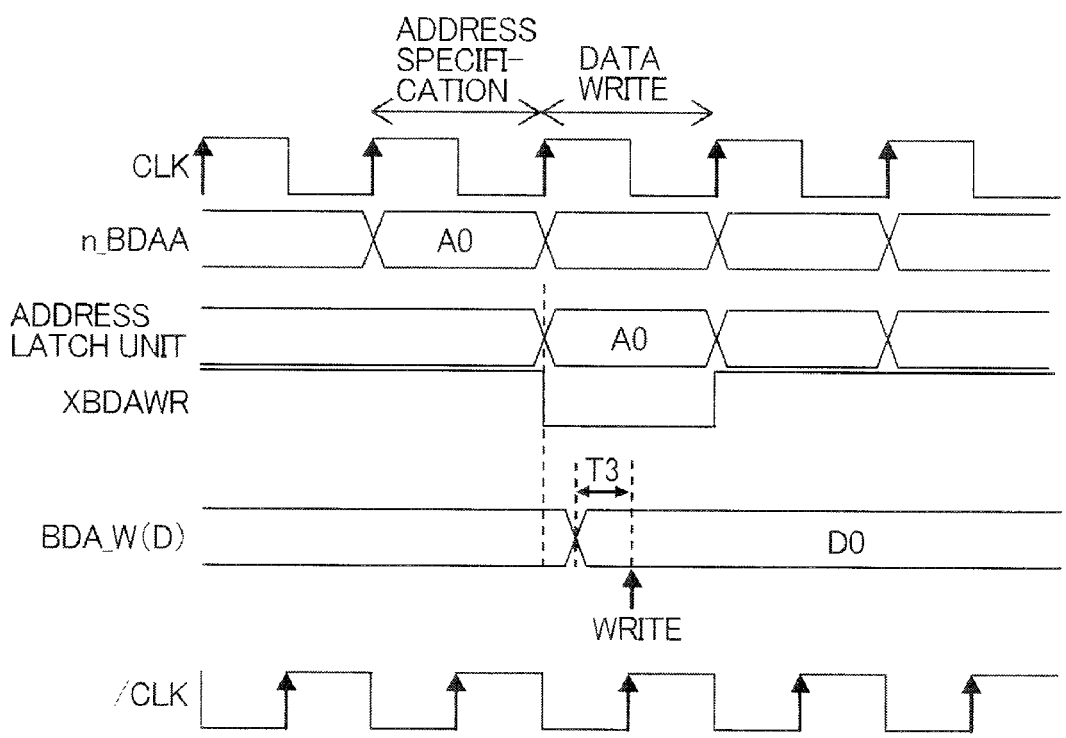
FIG. 13 depicts a time chart when data are written in the memory system.

For example, as shown in FIG. 9, the memory system 1000 may be disposed with a control circuit 900 between the DSP 200 and the memory 100. The control circuit 900 includes the read/write controller 300, the data storage unit 600, the address storage unit 700, the address decoder 400, the address comparator 800, the address select unit 1100, the address information select unit 1110, the write data select unit 1120, and the read data select unit 1130 shown in FIG. 1 and can be configured by an integrated circuit or discrete circuits. Alternatively, the entire memory system 1000 may be configured by one integrated circuit.

Although the circuits configuring the above memory system operate in synchronization with the rising edge of the clock signal in the described embodiment, the same applies to the case that the circuits operate in synchronization with the falling edge of the clock signal.

The above embodiments of the present invention are simply for facilitating the understanding of the present invention and are not in any way to be construed as limiting the present invention. The present invention may variously be changed or altered without departing from its spirit and encompass equivalents thereof.

It is claimed:

1. A memory access apparatus reading data from a memory, the memory including
    a terminal that address information is input to,
    a terminal that a clock signal changing at a predetermined cycle is input to,
    a terminal that a read command is input to, and
    a terminal that outputs data stored at an address identified by the address information at a timing of the clock signal changing from one level to the other level in accordance with the read command,
    the memory access apparatus comprising:
    an address information output unit that outputs the address information and the read command at a first timing of the clock signal changing from the one level to the other level; and
    a read data storage unit that stores data output from the memory at a second timing after the first timing of the clock signal changing from the one level to the other level, the read data storage unit storing the data at a third timing after the second timing of the clock signal changing from the one level to the other level.

2. A memory access apparatus writing data into a memory, the memory including
    a terminal that address information is input to,
    a terminal that a clock signal changing at a predetermined cycle is input to,
    a terminal that a write command is input to, and
    a terminal that data stored at an address identified by the address information at a timing of the clock signal changing from one level to the other level is input to in accordance with the write command,
    the memory access apparatus comprising:
    a data output unit that outputs data written into the memory, address information of the data, and the write command at a first timing of the clock signal changing from the one level to the other level, the data being written into the memory at a second timing after the first timing of the clock signal changing from the one level to the other level.

3. A memory access apparatus reading data from or writing data into a memory, the memory including
    a terminal that address information is input to,
    a terminal that a clock signal changing at a predetermined cycle is input to,
    a terminal that a read command or a write command is input to,
    a terminal that outputs data stored at an address identified by the address information at a first timing of the clock signal changing from one level to the other level in accordance with the read command, and
    a terminal that data stored at an address identified by the address information at a second timing of the clock signal changing from the one level to the other level is input to in accordance with the write command,
    the memory access apparatus comprising:
    a memory access requesting apparatus including
        a data reading unit that outputs read address information acting as address information of the data and a read command for reading the data at a third timing earlier by one cycle than the first timing of the clock signal changing from the one level to the other level, to output the data from the memory at the first timing, and
        a data writing unit that outputs a write address information acting as address information of the data at a fourth timing earlier by two cycles than the second timing of the clock signal changing from the one level to the other level, and outputs the data and a write command for writing the data at a fifth timing earlier by one cycle than the second timing of the clock signal changing from the one level to the other level, to write the data into the memory at the second timing;
    an address latch unit that the write address information output from the memory access requesting apparatus at the fourth timing is input to, the address latch unit outputting the write address information at the fifth timing; and
    a memory access controlling apparatus including
        a read controlling unit that outputs a read command and the read address information output from the memory access requesting apparatus at the third timing in accordance with the read command output at the third timing from the memory access requesting apparatus, to the memory, and
        a write controlling unit that outputs a write command, the write address information output from the address latch unit, and the data at the fifth timing in accordance with the write command output at the fifth timing from the memory access requesting apparatus, to the memory,
    if both the read command and the write command are output from the memory access requesting apparatus, the write controlling unit not outputting the write command, the write address information output from the address latch unit, and the data, to the memory.

4. The memory access apparatus of claim 3, further comprising:
   an address storage unit that stores the write address information output from the address latch unit; and
   a data storage unit that stores the data output from the memory access requesting apparatus, wherein
   if both the read command and the write command are output from the memory access requesting apparatus, the write controlling unit stores the write address information output from the address latch unit into the address storage unit, and stores the data output from the memory access requesting apparatus into the data storage unit.

5. The memory access apparatus of claim 4, wherein
   if the memory access requesting apparatus outputs neither a read command nor a write command, the write controlling unit outputs a write command to the memory and outputs the write address information stored in the address storage unit and the data stored in the data storage unit to the memory.

6. The memory access apparatus of claim 4, wherein
   if the memory access requesting apparatus outputs a read command, when the read address information output from the memory access requesting apparatus is identical to the write address information stored in the address storage unit, the read controlling unit outputs the data stored in the data storage unit to the memory access requesting apparatus.

* * * * *